United States Patent [19]

Tanaka

[11] Patent Number: 4,558,287

[45] Date of Patent: Dec. 10, 1985

[54] SIGNAL PROCESSING CIRCUIT

[75] Inventor: Tatsuo Tanaka, Yokohama, Japan

[73] Assignee: Kabushiki Kaisha Toshiba, Japan

[21] Appl. No.: 664,352

[22] Filed: Oct. 24, 1984

[30] Foreign Application Priority Data

Nov. 11, 1983 [JP] Japan ................................ 58-211886

[51] Int. Cl.$^4$ ............................................... H03F 3/45
[52] U.S. Cl. ..................................... 330/257; 330/252; 330/288
[58] Field of Search ................ 330/252, 257, 261, 288

[56] References Cited

U.S. PATENT DOCUMENTS 4,516,081  5/1985  Katakura ............................. 330/257

OTHER PUBLICATIONS

Japanese Patent Disclosure (Kokai) No. 58-168322.

Primary Examiner—Eugene LaRoche
Assistant Examiner—G. Wan
Attorney, Agent, or Firm—Finnegan, Henderson, Farabow, Garrett & Dunner

[57] ABSTRACT

A signal processing circuit includes a differential amplifying circuit for respectively generating first and second output signals from first and second output terminals, first and second input terminals of this circuit being respectively coupled to a signal input terminal and a constant voltage terminal, first and second transistors coupled between a power source terminal and the signal input and output terminals, third and fourth transistors coupled between the signal input and output terminals and a ground terminal, a fifth transistor which together with the first transistor constitutes a first current mirror circuit and allows the current corresponding to the second output signal to flow through the first transistor and also allows the current corresponding to the second output signal to flow through the second or fourth transistor, and a second current mirror circuit for leading the currents corresponding to the first output signal to the third transistor and to the fourth or second transistor.

16 Claims, 7 Drawing Figures

F I G. 1
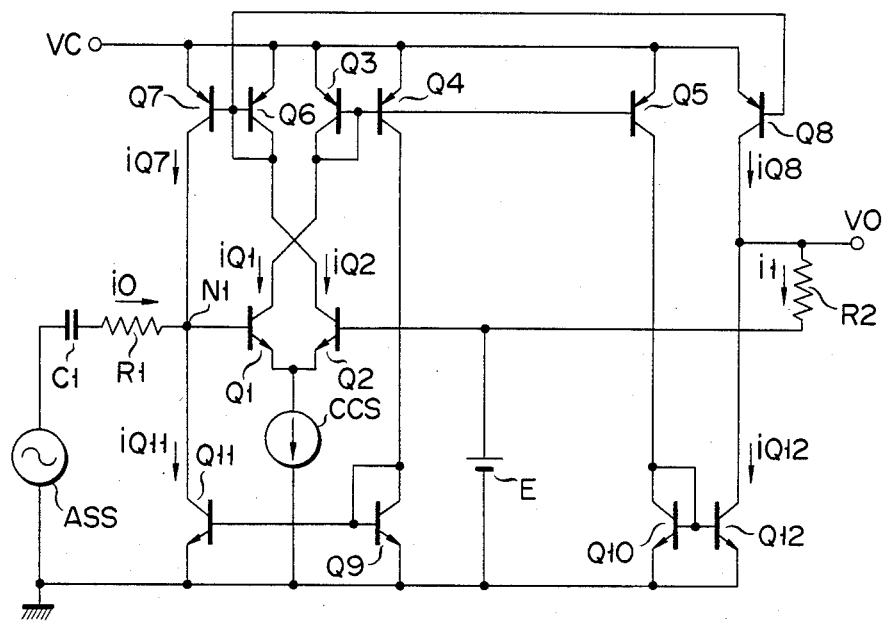
F I G. 2
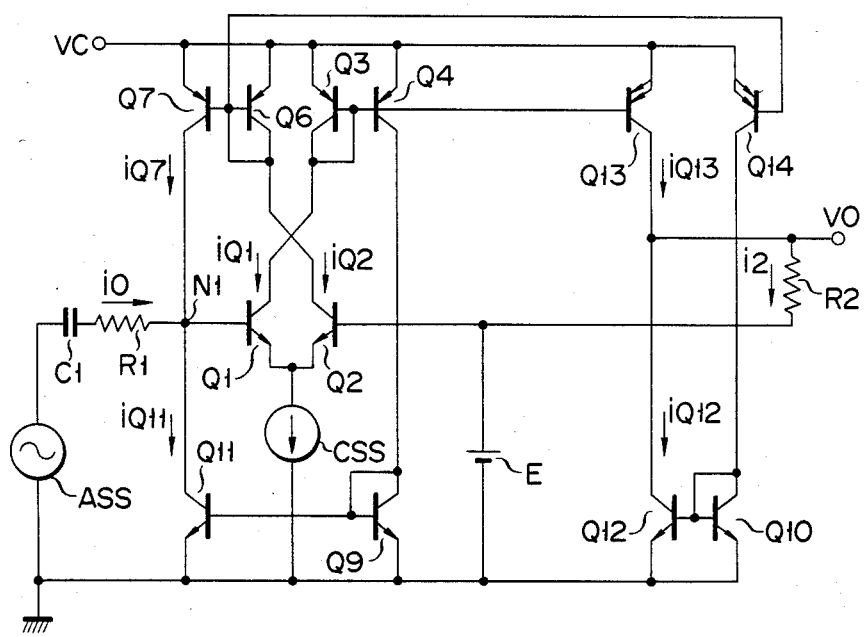

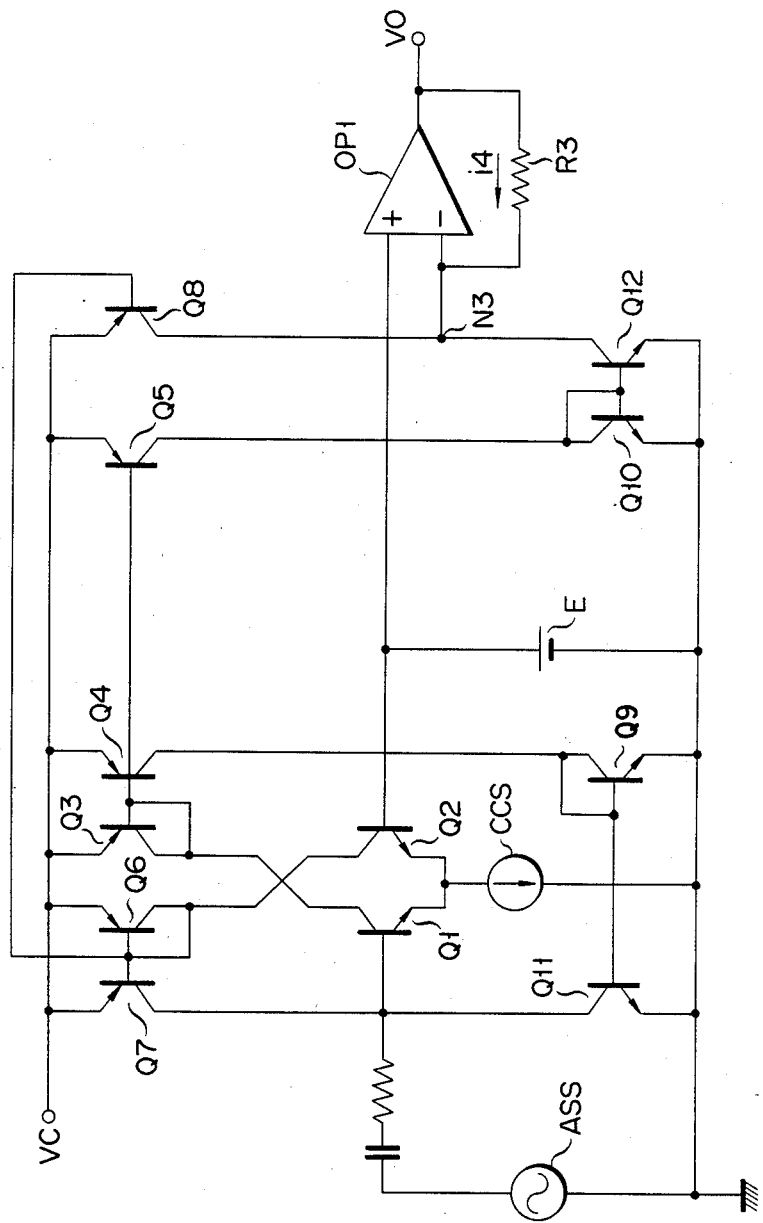
F I G. 5

SIGNAL PROCESSING CIRCUIT

BACKGROUND OF THE INVENTION

The present invention relates to a signal processing circuit which is used as an amplifying circuit, a variable filter circuit or the like.

Conventional amplifying circuits using an operational amplifier are constituted such that an AC voltage signal is supplied, for example, to a non-inverting input terminal of this operational amplifier and an AC output voltage signal of the operational amplifier is negative fed back to an inverting input terminal thereof through a resistor and the like. In the case where it is required to make the amplifying circuit of this kind operative as a general amplifying circuit, it is generally difficult to make this amplifying circuit operative at a low power source voltage. In addition, it is necessary to set a negative feedback amount to be large in order to keep the difference between a DC potential at the input terminal of operational amplifier and a DC potential at the output terminal, namely, the DC offset as small as possible. In this case, it is generally required to provide a large capacitance in the amplifier for prevention of the oscillation. When this kind of amplifying circuit is used, it is generally difficult to operate the amplifying circuit at a low power source voltage.

SUMMARY OF THE INVENTION

It is an object of the present invention to provide a signal processing circuit in which the DC offset is suppressed and which can operate at a low power source voltage.

This object is accomplished by a signal processing circuit comprising a power supply voltage line; a reference voltage line; a signal input terminal; a signal output terminal; a differential amplifying circuit for respectively generating first and second output signals from first and second output terminals in accordance with input voltages applied to first and second input terminals; a first current mirror circuit having an input current path coupled between the first output terminal of the differential amplifying circuit and the power supply voltage line and first and second output current paths which are coupled at one end to the power supply voltage line; a second current mirror circuit having an input current path coupled between the second output terminal of the differential amplifying circuit and the power supply voltage line, a first output current path coupled between the first input terminal of the differential amplifying circuit and the power supply voltage line, a second output current path which is coupled at one end to the power supply voltage line; a third current mirror circuit having an input current path coupled between the other end of the first output current path of the first current mirror circuit and the reference voltage line, and an output current path coupled between the first input terminal of the differential amplifying circuit and the reference voltage line; and a fourth current mirror circuit having an input current path between the other end of the second output current path of the first or second current mirror circuit and the reference voltage line, and an output current path which is coupled at one end to the signal output terminal and to the other end of the second output current path of the second or first current mirror circuit and which is coupled at the other end to the reference voltage line; wherein the first input terminal of the differential amplifying circuit is coupled to the signal input terminal, while the second input terminal is coupled to a constant voltage terminal.

In this invention, since the input voltage signal is converted to the current signal by use of the current mirror circuits, the stable circuit operation is obtained and the circuit can operate at a low voltage.

BRIEF DESCRIPTION OF THE DRAWINGS

FIG. 1 shows a signal processing circuit which functions as an inverting amplifying circuit according to an embodiment of the present invention;

FIG. 2 shows a signal processing circuit which functions as a non-inverting amplifying circuit according to another embodiment of the invention;

FIG. 5 shows a signal processing circuit which functions as a non-inverting amplifying circuit according to another embodiment of the invention.

DETAILED DESCRIPTION OF THE PREFERRED EMBODIMENTS

Figure 3:
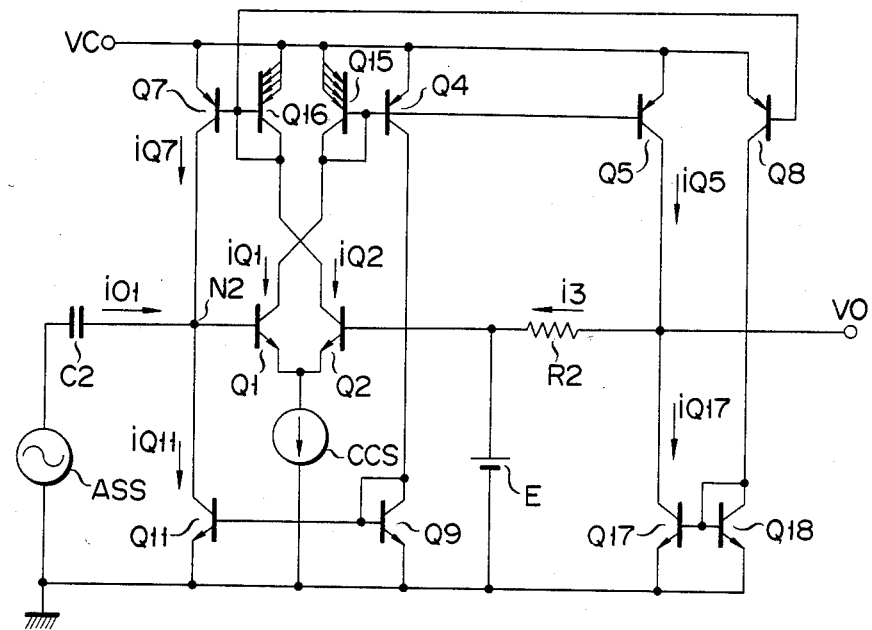
FIG. 3 shows a signal processing circuit which functions as a variable filter circuit according to still another embodiment of the invention.

FIG. 1 shows a signal processing circuit which functions as an inverting amplifying circuit according to an embodiment of the present invention. This signal processing circuit has a differential amplifying circuit which is constituted by npn transistors Q1 and Q2 whose emitters are grounded through a constant current source CCS. An AC signal generating source ASS is coupled to the base of the transistor Q1 through a capacitor C1 and a resistor R1. A constant voltage power source E is coupled to the base of the transistor Q2.

The collector of the transistor Q1 is coupled to the base and collector of a pnp transistor Q3 whose emitter is connected to a power source terminal VC. The bases of pnp transistors Q4 and Q5 are coupled to the base of the transistor Q3, while the emitters are coupled to the power source terminal VC. These pnp transistors Q4 and Q5 together with the transistor Q3 constitute a current mirror circuit. Namely, output currents of the same magnitude as an input current flowing through the current path of the transistor Q3 flow through the current paths of the transistors Q4 and Q5.

The collector of the transistor Q2 is coupled to the base and collector of a pnp transistor Q6 whose emitter is coupled to the power source terminal VC. The bases of pnp transistors Q7 and Q8 are coupled to the base of the transistor Q6, while the emitters are coupled to the power source terminal VC. These pnp transistors Q7 and Q8 together with the transistor Q6 constitute a current mirror circuit. Namely, output currents of the same magnitude as an input current flowing through the current path of the transistor Q6 flow through the current paths of the transistors Q7 and Q8.

The collectors of the transistors Q4, Q5, Q7, and Q8 are respectively grounded through the current paths of npn transistors Q9, Q10, Q11, and Q12. The base and collector of the transistor Q9 are coupled to the base of the transistor Q11. The base and collector of the transistor Q10 are coupled to the base of the transistor Q12.

On the other hand, the collectors of the transistors Q7 and Q11 are coupled to the base of the transistor Q1.

Further, the collectors of the transistors Q8 and Q12 are coupled to an output terminal VO. A resistor R2 is coupled between the output terminal VO and the base of the transistor Q2.

It is now assumed that an AC voltage signal Vin is generated from the AC signal generating source ASS and is supplied to the base of the transistor Q1 through the coupling capacitor C1 and resistor R1. In this case, assuming that the base potential of the transistor Q1, i.e., the potential at a node N1 is VN1 and an output current of the constant current source CCS is iO, collector currents iQ1 and iQ2 of the transistors Q1 and Q2 will be given by the following expressions since the base of the transistor Q2 is grounded through the constant voltage power source E when the case where an alternate current flows is considered.

$$iQ1 = \frac{IO}{1 + \exp\left(-\frac{VN1}{VT}\right)} \quad (1)$$

$$iQ2 = \frac{IO}{1 + \exp\left(\frac{VN1}{VT}\right)} \quad (2)$$

where, VT is a thermal voltage and is about 26 mV at an ordinary temperature.

The currents of the same magnitude of the collector current iQ1 of the transistor Q1 flow through the collectors of the transistors Q3, Q4, Q5, Q9, Q10, Q11, and Q12. In addition, the currents having the same magnitude as the collector current iQ2 of the transistor Q2 flow through the collectors of the transistors Q6, Q7 and Q8. Thus, a current iO flowing through the node N1 from the power source ASS is given by the following expression.

$$iO = iQ11 - iQ7 = iQ1 - iQ2 \quad (3)$$

where, iQ7 and iQ11 are collector currents of the transistors Q7 and Q11, respectively.

By substituting expressions (1) and (2) for expression (3), the following expression is obtained.

$$iO = \frac{IO}{1 + \exp\left(-\frac{VN1}{VT}\right)} - \frac{IO}{1 + \exp\left(\frac{VN1}{VT}\right)} \quad (4)$$

By differentiating expression (4) with respect to VN1, a mutual conductance $G_{in}$ is derived as shown in the following expression.

$$G_{in} = \frac{\partial iO}{\partial VN1} \quad (5)$$

$$= \frac{\frac{IO}{VT} \exp\left(-\frac{VN1}{VT}\right)}{\left\{1 + \exp\left(-\frac{VN1}{VT}\right)\right\}^2} + \frac{\frac{IO}{VT} \exp\left(\frac{VN1}{VT}\right)}{\left\{1 + \exp\left(\frac{VN1}{VT}\right)\right\}^2}$$

In FIG. 1, an input impedance $R_{in1}$ when it is viewed from the node N1 toward the base of the transistor Q1 is given by the following expression.

$$R_{in1} = \frac{1}{G_{in}} \quad (6)$$

Assume that the amplitude of the AC voltage signal $V_{in}$ is small and $$\frac{VN1}{VT} \approx 0.$$

In this case, an input impedance $R_{inO}$ is given by the following expression.

$$R_{inO} = \frac{1}{G_{inO}} = \frac{2VT}{IO} \quad (7)$$

Therefore, when the amplitude of the AC voltage signal $V_{in}$ is small, the current iO which flows through the node N1 is given by the following expression.

$$iO = \frac{V_{in}}{R1 + R_{inO}} = \frac{V_{in}}{R1 + \frac{2VT}{IO}} \quad (8)$$

On the other hand, assuming that the current flowing through the resistor R2 is i1, and AC output voltage VO1 at the output terminal VO is given by the following expression.

$$VO1 = i1 \times R2 \quad (9)$$

As already described before, a collector current iQ12 of the magnitude which is equal to that of the collector current iQ1 flows through the transistor Q12. A collector current iQ8 which is equal to the collector current iQ2 in magnitude flows through the transistor Q8. Thus, the current i1 is given by the following expression.

$$i1 = iQ8 - iQ12 = iQ2 - iQ1 = -iO \quad (10)$$

The following expression is obtained from expressions (8), (9) and (10).

$$VO1 = -iO \times R = -\frac{R2}{R1 + \frac{2VT}{IO}} \cdot V_{in} \quad (11)$$

As is obvious from expression (11), the phase of the output voltage signal VO1 is opposite to that of the input voltage signal Vin. In expression (11), when it is assumed tht R1=R2 and IO is set to a sufficiently large value and $$R1 >> \frac{2VT}{IO},$$

VO1 is made equal to $-V_{in}$. Consequently, the signal processing circuit shown in FIG. 1 can be made operative as an inverting amplifier having an amplification factor of "1". For instance, when IO=1 mA and R1=R2=10 kohms, $$\frac{2VT}{IO} = \frac{2 \times 26}{1} = 52 \, (\Omega).$$

Thus, $$\frac{2VT}{IO}$$

can be set to a value which is sufficiently smaller than R1 and R2.

In the signal processing circuit shown in FIG. 1, a plurality of series circuits each including two transistors are coupled between the power source terminal VC and the ground, so that a lower power source voltage, e.g., 0.9 V may be applied to the power source terminal VC in order to normally make the transistors Q1 to Q12 operative.

In addition, since the output current i1 is obtained as the difference between the collector currents iQ1 and iQ2 of the transistors Q1 and Q2, the DC components included in the collector currents iQ1 and iQ2 cancel each other, thereby suppressing the DC offset.

FIG. 2 shows a signal processing circuit which is constituted to operate a non-inverting amplifying circuit according to another embodiment of the present invention. This signal processing circuit is constituted substantially similarly to that shown in FIG. 1 excluding that, in place of the transistors Q5 and Q8, it uses a pnp transistor Q13 of the double emitter type whose base is coupled to the base of the transistor Q3 and whose emitters are coupled to the power source terminal VC and whose collector is grounded through the transistor Q12; and a pnp transistor Q14 of the double emitter type whose base is coupled to the base of the transistor Q6 and whose emitters are coupled to the power source terminal VC and whose collector is grounded through the transistor Q10.

In this signal processing circuit, a collector current IQ13 of the magnitude which is equal to twice that of the collector current IQ1 flowing through the transistor Q1 flows through the transistor Q13. The collector current IQ12 of the magnitude which is equal to twice that of the collector current IQ2 flowing through the transistor Q2 flows through the transistor Q12.

When an output current flowing through the resistor R2 is i2, an AC output voltage VO2 at the output terminal VO is given by the following expression.

$$VO2 = i2 \times R2 \tag{12}$$

This output current i2 are given by the following expression.

$$i2 = iQ13 - iQ12 = 2iQ1 - 2iQ2 = 2i0 \tag{13}$$

As is obvious from expression (13), the input current i0 and the output current i2 have the same phase.

The following expression is derived from expressions (8), (12) and (13).

$$VO2 = i2 \cdot R2 = 2iO \cdot R2 = \frac{2R2}{R1 + \frac{2VT}{IO}} \cdot V_{in} \tag{14}$$

As is obvious from expression (14), the output voltage signal VO1 and the input voltage signal $V_{in}$ have the same phase. In expression (14), for example, when it is assumed that R1=2R2 and IO is set sufficiently large and $$R1 >> \frac{2VT}{IO},$$

VO2 is equal to $V_{in}$. Consequently, the signal processing circuit shown in FIG. 2 can be made operative as a non-inverting amplifying circuit having an amplification factor of "1".

In this signal processing circuit, a similar effect as that shown in FIG. 1 can be attained.

FIG. 3 shows a signal processing circuit which operates as a variable filter circuit according to another embodiment of the invention.

This signal processing circuit is constituted substantially similarly to that shown in FIG. 1 except that it uses a capacitor C2 in place in the capacitor C1 and resistor R1; pnp transistors Q15 and Q16 of the multi-emitter type in place of the transistors Q3 and Q6; and npn transistors Q17 and Q18 in place of the transistors Q10 and Q12. The base of the transistor Q18 is coupled to the collector thereof and to the base of the transistor Q17. Also, the output terminal VO is coupled to the collectors of the transistors Q5 and Q17. The emitter area of each of the transistors Q5 and Q16 is formed so as to be four times the emitter area of each of the transistors Q4, Q5, Q7, and Q8.

In this signal processing circuit, the currents of the magnitude which is equal to one-fourth of that of the collector current iQ1 flowing through the transistor Q1 flow through the collectors of the transistors Q4, Q5, Q9, and Q11. The currents of the magnitude which is equal to one-fourth of the collector current iQ2 flowing through the transistor Q2 flow through the collectors of the transistors Q7, Q8, Q18, and Q17.

In this signal processing circuit, the AC input current iQ1 is given by the following expression.

$$iO1 = \frac{1}{4}(iQ11 - iQ7) = \frac{1}{4}(iQ1 - iQ2) \tag{15}$$

Thus, when the amplitude of the input voltage signal is small, an input impedance $R_{in2}$ when it is viewed from a node N2 toward the base of the transistor Q1 is given by the following expression.

$$R_{in2} = \frac{2VT}{IO} \times 4 = \frac{8VT}{IO} \tag{16}$$

On the other hand, the input current iQ1 which flows into the node N2 through the capacitor C2 is given by the following expression.

$$iO1 = \frac{V_{in}}{\frac{1}{j\omega C2} + \frac{8VT}{IO}} = \frac{j\omega C2}{1 + j\omega C2 \frac{8VT}{IO}} \cdot V_{in} \tag{17}$$

where, $\omega$ is an angular frequency.

Assuming that an output current which flows through the resistor R2 toward the power source E is i3, an output voltage signal VO3 will be given by the following expression.

$$VO3 = i3 \cdot R2 \tag{18}$$

As already mentioned before, since collector currents iQ5 and iQ17 flowing through the transistors Q5 and Q17 are equal to one-fourth of the collector currents iQ1 and iQ2, respectively, the output current i3 is expressed by the following expression.

$$i3 = iQ5 - iQ17 = \frac{1}{4}(iQ1 - iQ2) = iO2 \quad (19)$$

From expressions (7), (18) and (19), the output voltage VO3 is given by the following expression.

$$VO3 = \frac{1}{1 + j\omega C2 \frac{8VT}{IO}} \cdot V_{in} \quad (20)$$

It is now assumed that $VO3 = G_O(\omega) \cdot V_{in} = G_1(\omega) \cdot G_2(\omega) \cdot V_{in}$, where, $$G_1(\omega) = \frac{1}{1 + j\omega C2 \frac{8VT}{IO}}$$

$$G_2(\omega) = j\omega C2 \cdot R2$$

Figure 4:
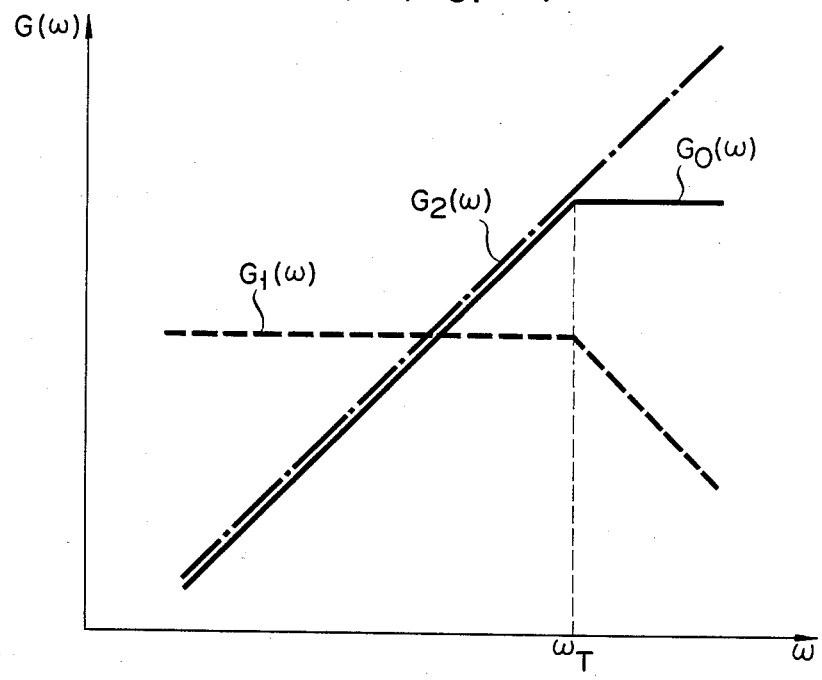
FIG. 4 is a characteristic diagram showing transfer functions of the variable filter circuit shown in FIG. 3.

As shown in FIG. 4, this transfer function $G_O(\omega)$ is held at a substantially constant level until a turnover frequency $\omega_T$. When the angular frequency becomes higher than this turnover frequency, the transfer function $G_O(\omega)$ gradually attenuates. In this way, the signal processing circuit shown in FIG. 3 functions as a low-pass filter circuit.

The turnover frequency $\omega_T$ is given by the following expression.

$$\omega_T = \frac{IO}{8VTC2}$$

Thus, by suitably changing the output current IO of the constant current source CCS, the turnover frequency $\omega_T$ can be varied, so that this signal processing circuit can be made operative as a variable filter circuit.

FIG. 5 shows a signal processing circuit which operates as a non-inverting amplifying circuit according to still another embodiment of the invention. This signal processing circuit is constituted substantially similarly to that shown in FIG. 1 except that the resistor R2 is removed and an operational amplifier OP1 and a resistor R3 are used. The non-inverting input terminal of the operational amplifier OP1 is coupled to the constant voltage source E, and the inverting input terminal is coupled to the collectors of the transistors Q8 and Q12, and the output terminal is coupled to the inverting input terminal thereof through the resistor R3 and to the output terminal VO.

A node N3 is a virtual earth point of the operational amplifier OP1. Assuming that a signal current flowing through the resistor R3 is i4, an output AC voltage signal VO4 at the output terminal VO is given by the following expression.

$$VO4 = i4 \cdot R3 = (iQ12 - iQ10) \cdot R3 \quad (21)$$
$$= (iQ1 - iQ2) \cdot R3 = iO \cdot R3$$
$$= \frac{R3}{R1 + \frac{2VT}{IO}} \cdot V_{in}$$

Assuming that $$R1 >> \frac{2VT}{IO}$$

and R1=R3, VO4 is equal to $V_{in}$. Consequently, this signal processing circuit can be operated as a non-inverting amplifying circuit having an amplification factor of "1".

Also in this embodiment, an effect similar to that in the foregoing embodiment is derived; furthermore, the output impedance at the output terminal VO can be reduced by the operational amplifier OP1.

Figure 7:
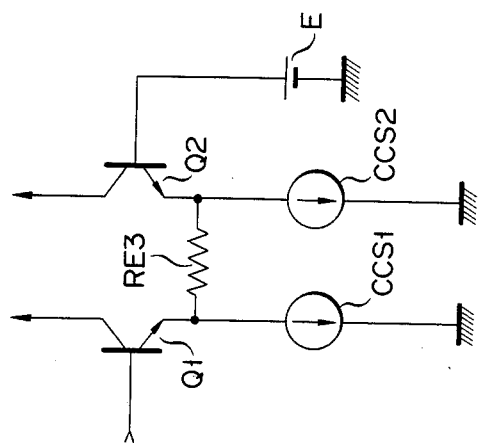
FIGS. 6 and 7 show modified forms of a differential amplifying circuit which is used in the above embodiments, respectively.
Figure 6:
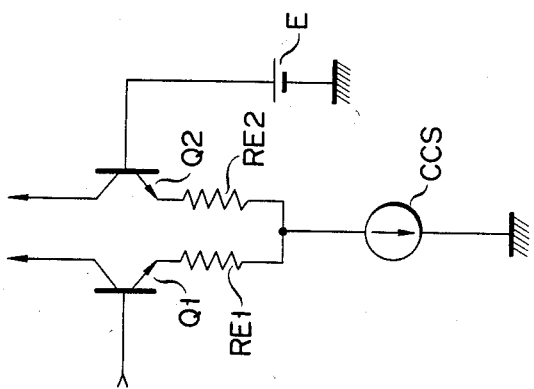

The present invention has been described in the above with respect to the embodiments; however, the invention is not limited to only these embodiments. For instance, in the differential amplifying circuit constituted by the transistors Q1 and Q2, emitter resistors RE1 and RE2 may be respectively coupled to the transistors Q1 and Q2 as shown in FIG. 6, while a resistor RE3 may be coupled between the emitters of the transistors Q1 and Q2 and constant current sources CCS1 and CCS2 may be coupled respectively to the emitters of the transistors Q1 and Q2 as shown in FIG. 7. On the other hand, for example, in the embodiments shown in FIGS. 1 and 2, it is possible to disconnect the resistor R2 from the power source E and to couple the resistor R2 to the positive terminal of a constant voltage power source which is independently provided from the power source E and whose negative terminal is grounded.

What is claimed is:

1. A signal processing circuit comprising:
    a power supply voltage line, a reference voltage line and a constant voltage terminal;
    a signal input terminal and a signal output terminal;
    a differential amplifying circuit for generating first and second output signals from first and second output terminals, first and second input terminals of said differential amplifying circuit being respectively coupled to said signal input terminal and constant voltage terminal;
    a first current mirror circuit having an input current path coupled between the first output terminal of said differential amplifying circuit and said power supply voltage line, and first and second output current paths which are each coupled at one end to said power supply voltage line;
    a second current mirror circuit having an input current path coupled between the second output terminal of said differential amplifying circuit and said power supply voltage line, a first output current path coupled between said signal input terminal and the power supply voltage line, and a second output current path coupled between said signal output terminal and the power supply voltage line;
    a third current mirror circuit having an input current path coupled between the other end of the first output current path of said first current mirror circuit and said reference voltage line, and an output current path coupled between said signal input terminal and the reference voltage line; and
    a fourth current mirror circuit having an input current path coupled between the other end of the second output current path of said first current mirror circuit and said reference voltage line, and an output current path coupled between said signal output terminal and the reference voltage line.

2. A signal processing circuit according to claim 1, wherein said differential amplifying circuit comprises: constant current source means; and first and second transistors of the same conductivity type whose bases are respectively coupled to said signal input terminal and constant voltage terminal and whose emitters are together coupled to said reference voltage line through said constant current source means.

3. A signal processing circuit according to claim 2, wherein said differential amplifying circuit further has resistors coupled respectively to the emitters of said first and second transistors.

4. A signal processing circuit according to claim 2, wherein said differential amplifying circuit further has a resistor coupled between the emitters of said first and second transistors, and said constant current source means has first and second constant current sources coupled to the emitters of said first and second transistors.

5. A signal processing circuit according to claim 2, wherein said first current mirror circuit comprises a third transistor whose collector is coupled to the collector of said first transistor and whose emitter is coupled to said power supply voltage line and whose base is coupled to the collector thereof, and fourth and fifth transistors whose emitters are coupled to the power supply voltage line and whose bases are coupled to the base of said third transistor, said second current mirror circuit comprises a sixth transistor whose emitter and collector are respectively coupled to said power supply voltage line and to the collector of said second transistor and whose base is coupled to the collector thereof, a seventh transistor whose current path is coupled between said power supply voltage line and said signal input terminal and whose base is coupled to the base of said sixth transistor, and an eighth transistor whose current path is coupled between said power supply voltage line and said signal output terminal and whose base is coupled to the base of said sixth transistor, said third current mirror circuit comprises a ninth transistor whose base and collector are coupled to the collector of said fourth transistor and whose emitter is coupled to said reference voltage line, and a tenth transistor whose current path is coupled between said signal input terminal and said reference voltage line and whose base is coupled to the base of said ninth transistor, and said fourth current mirror circuit comprises an eleventh transistor whose base and collector are coupled to the collector of said fifth transistor and whose emitter is coupled to said reference voltage line, and a twelfth transistor whose current path is coupled between said signal output terminal and the reference voltage line and whose base is coupled to the base of said eleventh transistor.

6. A signal processing circuit according to claim 5, wherein said first, second and ninth to twelfth transistors are npn transistors, and said third to eighth transistors are pnp transistors.

7. A signal processing circuit according to claim 6, further comprising resistive means connected between said signal output terminal and constant voltage terminal.

8. A signal processing circuit according to claim 6, further comprising resistive means connected between said signal output terminal and the collectors of said eighth and twelfth transistors and an operational amplifier whose inverting input terminal is connected to the collectors of said eighth and twelfth transistors, whose non-inverting input terminal is connected to said constant voltage terminal and whose output terminal is connected to said signal output terminal.

9. A signal processing circuit comprising:
a power supply voltage line, a reference voltage line and a constant voltage terminal;
a signal input terminal and a signal output terminal;
a differential amplifying circuit for generating first and second output signals from first and second output terminals, first and second input terminals of said differential amplifying circuit being respectively coupled to said signal input terminal and constant voltage terminal;
a first current mirror circuit having an input current path coupled between the first output terminal of said differential amplifying circuit and said power supply voltage line, a first output current path one end of which is coupled to said power supply voltage line, and second output current path coupled between said signal output terminal and said power supply voltage line;
a second current mirror circuit having an input current path coupled between the second output terminal of said differential amplifying circuit and said power supply voltage line, a first output current path coupled between said signal input terminal and the power supply voltage line, and a second output current path one end of which is coupled to said power supply voltage line;
a third current mirror circuit having an input current path coupled between the other end of the first output current path of said first current mirror circuit and said reference voltage line, and an output current path coupled between said signal input terminal and the reference voltage line; and
a fourth current mirror circuit having an input current path coupled between the other end of the second output current path of said second current mirror circuit and said reference voltage line, and an output current path coupled between said signal output terminal and the reference voltage line.

10. A signal processing circuit according to claim 9, wherein said differential amplifying circuit comprises: constant current source means; and first and second transistors of the same conductivity type whose bases are respectively coupled to said signal input terminal and constant voltage terminal and whose emitters are together coupled to said reference voltage line through said constant current source means.

11. A signal processing circuit according to claim 10, wherein said differential amplifying circuit further has resistors coupled respectively to the emitters of said first and second transistors.

12. A signal processing circuit according to claim 10, wherein said differential amplifying circuit further has a resistor coupled between the emitters of said first and second transistors, and said constant current source means has first and second constant current sources coupled to the emitters of said first and second transistors.

13. A signal processing circuit according to claim 10, wherein said first current mirror circuit comprises a third transistor whose collector is coupled to the collector of said first transistor and whose emitter is coupled to said power supply voltage line and whose base is coupled to the collector thereof, and fourth and fifth transistors whose emitters are coupled to the power supply voltage line and whose bases are coupled to the base of the third transistor.

said second current mirror circuit comprises a sixth transistor whose emitter and collector are respectively coupled to said power supply voltage line and to the collector of said second transistor and whose base is coupled to the collector thereof, and seventh transistor whose current path is coupled between said power supply voltage line and the signal input terminal and whose base is coupled to the base of said sixth transistor, and an eighth transistor whose current path is coupled between the power supply voltage line and the signal output terminal and whose base is coupled to the base of said sixth transistor, said third current mirror circuit comprises a ninth transistor whose base and collector are coupled to the collector of said fourth transistor and whose emitter is coupled to said reference voltage line and a tenth transistor whose current path is coupled between the signal input terminal and the reference voltage line and whose base is coupled to the base of the ninth transistor, and said fourth current mirror circuit comprises an eleventh transistor whose base and collector are coupled to the collector of said eighth transistor and whose emitter is coupled to the reference voltage line, and a twelfth transistor whose current path is coupled between said signal output terminal and said reference voltage line and whose base is coupled to the base of the eleventh transistor.

14. A signal processing circuit according to claim 13, wherein said first, second and ninth to twelfth transistors are npn transistors, and said third to eighth transistors are pnp transistors.

15. A signal processing circuit according to claim 13, wherein said fifth and eighth transistors are double emitter transistors.

16. A signal processing circuit according to claim 13, wherein said third and sixth transistors are multi-emitter transistors.

* * * * *